United States Patent [19]
Takahashi et al.

[11] 3,724,955

[45] Apr. 3, 1973

[54] DISCRIMINATION CIRCUIT OF PHYSICAL QUANTITIES

[75] Inventors: Makoto Takahashi, Sagamihara; Takao Hashimoto, Kawasaki, both of Japan

[73] Assignee: Yashica Company, Ltd., Japan

[22] Filed: July 6, 1971

[21] Appl. No.: 159,682

[30] Foreign Application Priority Data

July 7, 1970 Japan ....................45/58956
July 7, 1970 Japan ....................45/58957

[52] U.S. Cl. ....................356/227, 356/218, 356/226
[51] Int. Cl. ....................G01j 1/42, G01j 1/44
[58] Field of Search .......356/218, 224, 226; 356/227

[56] References Cited

UNITED STATES PATENTS

| | | | |
|---|---|---|---|
| 3,594,088 | 7/1971 | Akiyama et al. | 356/227 |
| 3,436,158 | 4/1969 | Schmitt | 356/227 |
| 3,452,656 | 7/1969 | Ruhle et al. | 356/218 |
| 3,581,643 | 6/1971 | Yoshimura | 356/226 |

*Primary Examiner*—Ronald L. Wibert
*Assistant Examiner*—V. P. McGraw
*Attorney*—Robert D. Flynn et al.

[57] ABSTRACT

A discrimination circuit of physical quantities comprises a converter element for converting a physical quantity to an electrical quantity which is compared with a reference potential in a differential amplifier. The output terminal of the differential amplifier is connected to the input terminal of a first switching device and the output terminal thereof is connected to the input terminal of a second switching device. A feedback circuit including a capacitor and a resistor is provided between each output terminal of the first and second switching devices and one input terminal of the differential amplifier. The differential amplifier produces an output only when the converted electrical quantity exceeds the reference potential (defined, for example, by the resistance of a potentiometer), and the first and second switching devices are brought into three discriminative states in accordance with the value of the first input signal of the differential amplifier which is a function of the converted electrical quantity. That is, the discriminative stages correspond to when the physical quantity is in the allowable region and over and under the allowable region. The first and second switching devices oscillate while the physical quantity is in the allowable region, the region being determined by a variable resistor and the oscillation frequency being determined by a capacitor in a feedback circuit. One or the other of the switching devices are ON when either of the two states discriminative states exist.

10 Claims, 16 Drawing Figures

DISCRIMINATION CIRCUIT OF PHYSICAL QUANTITIES

BACKGROUND OF THE INVENTION

This invention relates to a discrimination circuit for converting various physical quantities into electric quantities and for determining whether the physical quantities are included in a range including a reference value, or above or below the reference value. The invention is especially suitable for use in an exposure determining circuit wherein the brightness of an object to be photographed is converted into an electrical quantity and the converted value is used to determine a condition of photographing suitable for the given brightness of the object.

Various types of discrimination circuits have been proposed. According to one type, the brightness of the object is classified into four grades which are displayed by different operations of one display lamp including continuous lighting, flickering, momentary lighting and extinguishing.

However, with the exposure discrimination circuit using such a lighting system, it is necessary to determine the value of exposure by discriminating such complicated lighting conditions of a single display lamp, thus psychologically overloading the photographer. Moreover, as the flickering period of the display lamp is determined by the heat capacity thereof the lamp is required to have an extremely uniform quality which limits the freedom of design.

SUMMARY OF THE INVENTION

It is the principal object of this invention to provide an improved discrimination circuit of physical quantities which can obviate various defects mentioned above.

A more specific object of this invention is to provide an improved exposure meter for use in a photographic camera which is compact in construction, can be readily incorporated into the body of the camera and can give accurate visual indication whether the exposure is correct or not.

Another object of this invention is to provide an improved discrimination circuit wherein the range of the desired value can be readily adjustable.

Still another object of this invention is to provide a novel discrimination circuit which can operate stably even when the input or the quantity to be determined varies greatly.

In accordance with this invention there is provided a discrimination circuit comprising converter means for converting a physical quantity into an electrical quantity ; a differential amplifier having a first input terminal connected to the output of the converter means, and a second input terminal, the differential amplifier producing an output only when the potential of the first input terminal exceeds that of the second input terminal ; first and second switching means connected to the output of the differential amplifier to be driven alternately ; first and second display lamps controlled by the outputs of the first and second switching elements, respectively ; a capacitor connected between the output of the first switching means and the second input terminal of the differential amplifier ; a first resistor connected between the output of the second switching means and the second input terminal of the differential amplifier ; a source of electrical power supply ; a resistance potentiometer connected across the electrical power source to produce a constant potential ; and a second resistor for supplying the constant potential to the second input terminal of the differential amplifier ; the differential amplifier driving one of the first and second switching means when the potential of the first input terminal of the differential amplifier exceeds that of the second input terminal, and, the output of at least one of the first and second switching mean being fed back to the second input terminal of the differential amplifier through at least one of the capacitor and the first resistor so as to selectively operate the first and second display lamps.

In a modified embodiment instead of connecting the first and second display lamps directly to the outputs of the first and second switching means, a rectifier-integrator is connected to the output of the first or second switching means for rectifying the AC component of the output and for integrating the rectified AC component and a third switching means is connected to the output of the rectifier-integrator to operate a first display amp. A fourth switching means is connected to operate when the output from the third switching means coincides with the output from the first switching means and a fifth switching means is connected to operate when the output from the third switching means coincides with the output from the second switching means. A second display lamp is connected to the output of the fourth switching means and third display lamp is connected to the output of the fifth switching means. When used as an exposure meter of a camera, first to third display lamps are utilized to independently display the correct exposure, under exposure and excessive exposure, respectively.

BRIEF DESCRIPTION THE DRAWINGS

The invention can be more fully understood from the following detailed description when taken in conjunction with the accompanying drawings in which.

Figure 1:
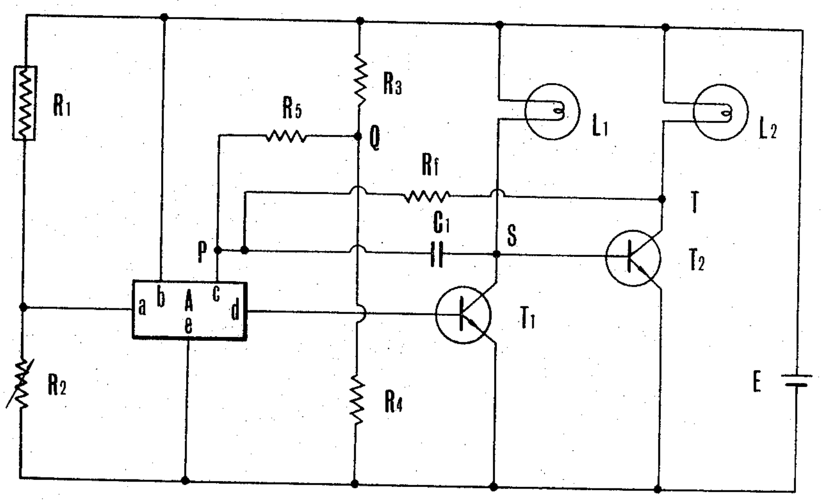
FIG. 1 is a connection diagram of one example of the discrimination circuit embodying the invention.
Figure 3A:
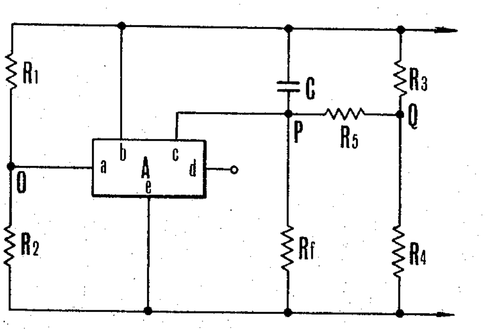
Figure 3B:
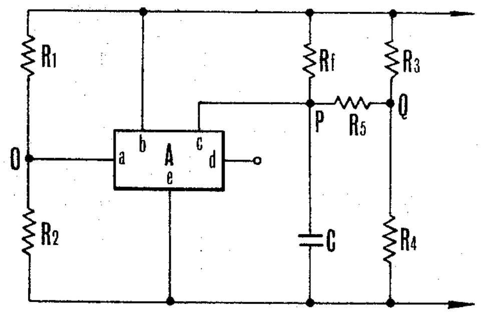
Figure 6:
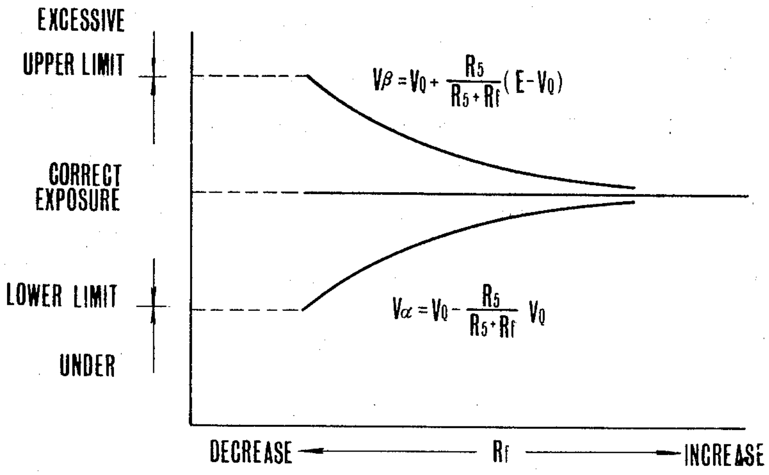
Figure 7:
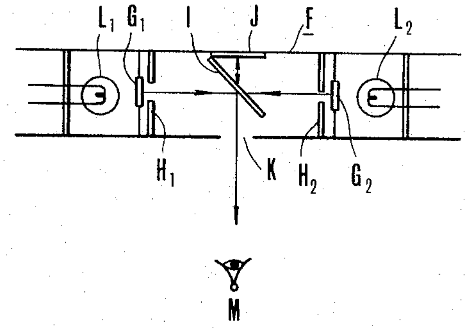
Figure 8A:
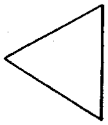
Figure 8B:
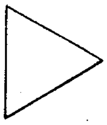
Figure 9:
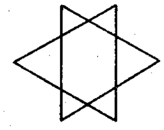
Figure 10:
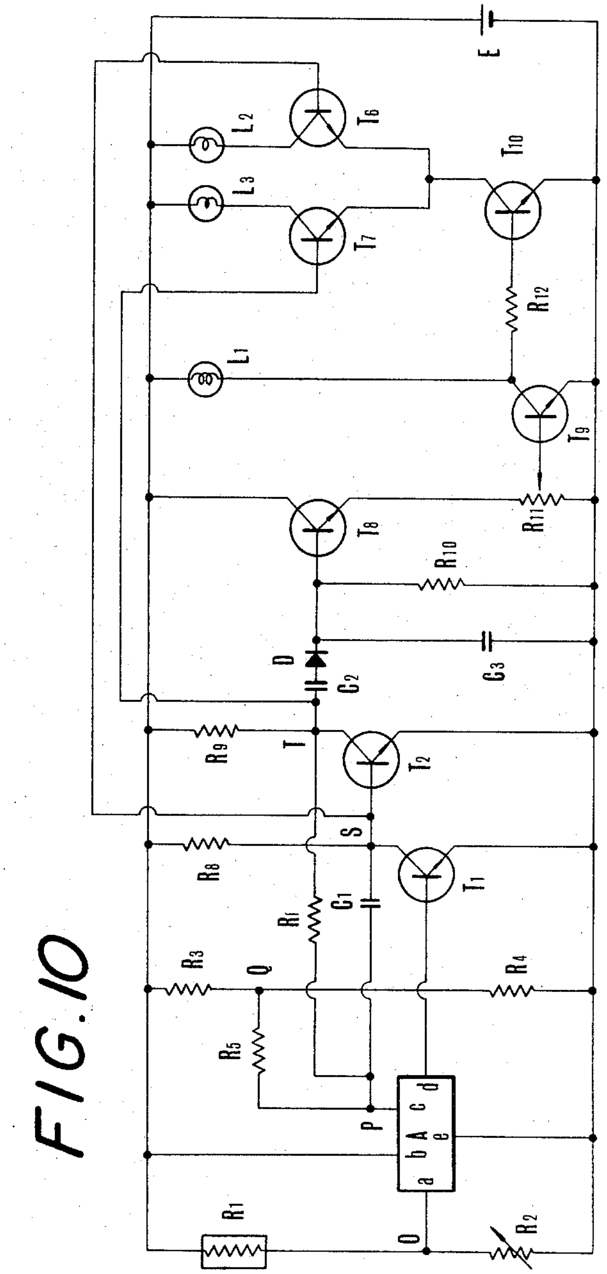

FIGS. 3*a* and 3*b* show equivalent circuits under different operating conditions of the circuit shown in FIG. 1 ;

FIGS. 4*a*, 4*b*, 4*c* and 5*a*, 5*b*, 5*c* show waveforms at various portions of the discrimination circuit shown in FIG. 1 ;

FIG. 6 is a graph to illustrate the operating range of the circuit shown in FIG. 1 ;

FIG. 7 is a diagrammatic sectional view of the display unit utilized in the circuit shown in FIG. 1 ;

FIGS. 8*a*, 8*b* and 9 show examples of display patterns produced by the display unit shown in FIG. 7 ; and FIG. 10 shows a connection diagram of a modified embodiment.

Throughout the drawings the same or corresponding elements are designated by the same reference characters.

DESCRIPTION OF THE PREFERRED EMBODIMENTS

Figure 2:
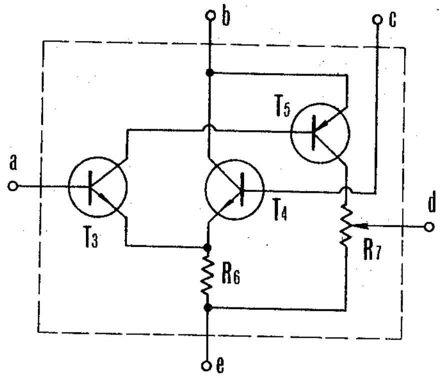
FIG. 2 shows the details of the differential amplifier used in the circuit shown in FIG. 1.

Referring now to FIG. 1, there is shown a preferred embodiment of the discrimination circuit embodying the invention wherein a photoconductive element is used to determine the correct exposure. The discrimination circuit comprises a photoconductive element $R_1$ whose resistance varies in accordance with the brightness of an object to be photographed, a variable resistor $R_2$ which is adjusted in accordance with the sensitivity of the photographic film used, and an differential amplifier A having a high input impedance and a high sensitivity. The differential amplifier is provided with a first input terminal *a*, a second input terminal *c* and an output terminal *d*, the first input terminal *a* being connected to the juncture 0 between photoconductive element $R_1$ and variable resistor $R_2$. slide As shown in FIG. 2, the differential amplifier A comprises three transistors $T_3$, $T_4$ and $T_5$, a resistor $R_6$ and a variable resistor $R_7$. When the potential of the first input terminal a exceeds that of the second input terminal *c* an output voltage substantially equal to the source voltage appears at the output terminal *d*.

Referring again to FIG. 1, the discrimination circuit further comprises a transistor $T_1$ with its base electrode connected to the output terminal *d* of the differential amplifier A, another transistor $T_2$ with its base electrode connected to the collector electrode of transistor $T_1$, a source E, a first display lamp $L_1$ connected between the collector electrode of transistor $T_1$ and the source E, a second display lamp $L_2$ connected between the collector electrode of transistor $T_2$ and source E, and a capacitor $C_1$ connected between the collector electrode of transistor $T_1$ and the second input terminal *c* of the differential amplifier A. Furthermore, there are provided a resistor $R_f$ connected between the collector electrode of transistor $T_2$ and the second input terminal *c* of the differential amplifier A, potentiometer resistors $R_3$ and $R_4$ connected in series across source E, and a fixed resistor $R_5$ connected between the juncture Q between resistors $R_3$ and $R_4$, and the second input terminal *c* of the differential amplifier A.

In operation, a current I corresponding to the brightness of the light impinging upon photoconductive element $R_1$ flows through a closed circuit that can be traced from one terminal of source E, through photoconductive element $R_1$ and variable resistor $R_2$ back to the other terminal of the source, thus creating a potential $V_o = (R_2 \cdot I)/(R_1 + R_2)$ at the juncture O. As above described, this potential $V_o$ varies in accordance with the brightness of the light impinging upon the photoconductive element $R_1$. Variation in the potential $V_o$ at the juncture O causes the first and second display lamps $L_1$ and $L_2$ to operate in the following manner.

1. Lamp $L_1$ is extinguished, lamp $L_2$ is lighted,
2. Lamps $L_1$ and $L_2$ are lighted, and extinguished alternately
3. Lamp $L_1$ is lighted, lamp $L_2$ is extinguished.

In the following, the operation of the circuit will be described where the potential $V_o$ at point O. gradually increases, that is where the intensity of the light impinging upon photoconductive element $R_1$ increases gradually.

Where the potential $V_o$ is low, since this potential which is applied to the first input terminal of the differential amplifier A is lower than the potential $V_p$ of point P applied to the second input, the differential amplifier A does not produce any output. As a consequence, transistor $T_1$ having its base electrode connected to the output terminal *d* of the differential transformer is OFF whereas transistor $T_2$ having its base electrode connected to the collector electrode of transistor $T_1$ is ON, thus lighting only the second lamp $L_2$ connected to the collector electrode of transistor $T_2$ and thereby displaying that the brightness of the light impinging upon photoconductive element $R_1$ is low.

FIG. 3*a* shows an equivalent circuit of the discrimination circuit under these conditions in which the resistor $R_f$ is connected between point P and the ground and capacitor C is connected between point P and the source. As a consequence, by neglecting the effect of the differential amplifier A having a high input impedance, the potential $V_p$ at point P can be expressed as follows:

$$V_p = [R_f/(R_f + R_5)] \cdot V_Q \qquad (1)$$

where $V_Q$ represents the potential of point Q.

This potential $V_p$ does not vary because the potential $V_Q$ at the juncture Q of resistors $R_3$ and $R_4$ is constant. Accordingly, the voltage range in which only the second display lamp $L_2$ is lighted, or the range of the potential of point Q in which the differential amplifier A does not produce an output at the output terminal is expressed by the following equation.

$$V_o < V_p = [R_f/(R_f + R_5)]\, V_Q = V_Q - [R_5/(R_f + R_5)]\, V_Q = V_\alpha \qquad (2)$$

Figures 4A, 4B, 4C, 5A, 5B, 5C:
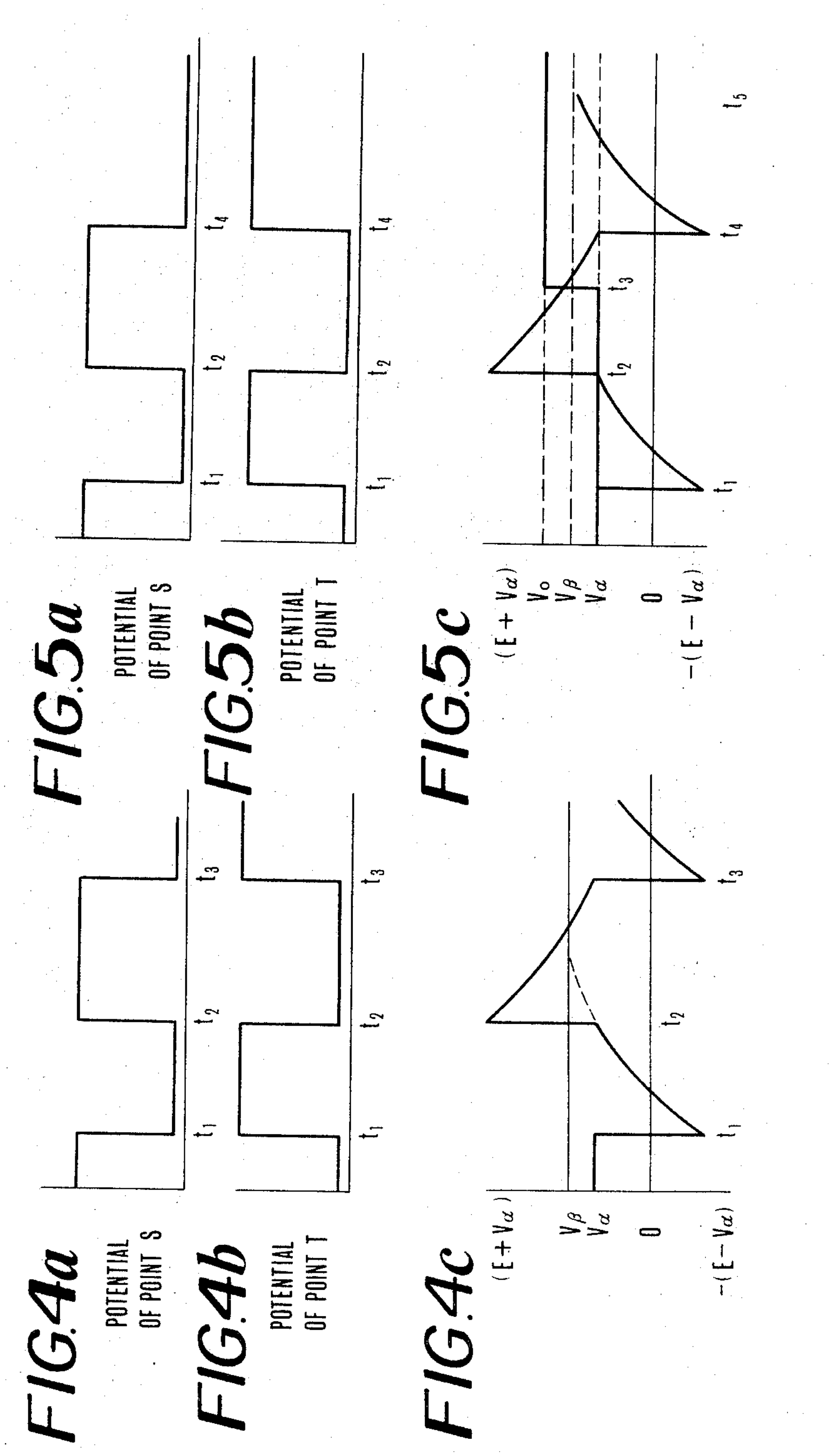

Considering now the case wherein the potential $V_o$ at point O is increased, or the brightness of the light impinging upon the photoconductive element $R_1$ is increased to satisfy an equation $V_o = V_p = V_\alpha$ . Under these conditions the differential amplifier A functions to supply to the base electrode of transistor $T_1$ a voltage substantially equal to the source voltage. Then, transistor $T_1$ becomes ON at a time $t_1$ as shown in FIG. 4*a* whereas transistor $T_2$ becomes OFF at the time $t_1$ as shown in FIG. 4*b*, thus lighting only the first display lamp $L_1$. In this manner, when transistor $T_1$ is ON and transistor $T_2$ is OFF the discrimination circuit shown in FIG. 1 can be shown by another equivalent circuit shown in FIG. 3*b* wherein capacitor C is connected between point P and the ground and resistor $R_f$ is connected between point P and the source. Under these conditions, as capacitor $C_1$ and resistor $R_f$ cooperate to feed back the potential variations at points S and T to point P connected to the second input terminal of differential transformer A, the potential $V_p$ at point P assumes a value $-\ (E - V_\alpha)$ for a moment at the time $t_1$ and then gradually increases between $t_1$ and $t_2$ as shown in FIG. 4C. The rise in potential $V_p$ at point P can be expressed by the following equation:

$$V_P(t) = V_Q + \frac{R_5}{R_5 + R_f}(E - V_Q) - \left\{(E - V_\alpha) + V_Q + \frac{R_5}{R_5 + R_f}(E - V_Q)\right\} e^{-\frac{t - t_1}{\tau}} \qquad (3)$$

where $\tau = C_1 (R_f \cdot R_5)/(R_f + R_5)$ $R_3, R_4 << R_5, R_f$ and $E$ represents the voltage of source E.

Equation 3 shows that the potential $V_p$ at point P approaches $V_\beta = V_Q + [R_5/(R_5+R_f)](E - V_Q)$ shown in FIG. 4c as the time elapses.

In this manner, the potential $V_p$ increases and when it reaches a value $V_p = V_\alpha = [R_f/(R_5+R_f)] V_Q = V_o$, the output potential of the differential amplifier decreases to substantially zero voltage, thus turning OFF transistor $T_1$ and OFF transistor $T_2$. Under these conditions, only the second display lamp $L_2$ is lighted and the connection of the circuit shown in FIG. 1 changes to that shown in FIG. 3b. At this time, the positive feedback function of capacitor $C_1$ momentarily increases the potential $V_p$ at point P to $E + V$ at a time $t_2$, and then gradually decreases during the interval between $t_2$ and $t_3$, as shown by FIG. 4c, according $$V_p(t) = \frac{R_f}{R_f+R_5} V_Q + \left\{(E+V_\alpha) - \frac{R_f}{R_f+R_5} V_Q\right\} e^{-\frac{t-t_2}{\tau}} \quad (4)$$

where $\tau = C_1 (R_f \cdot R_5)/(R_f + R_5)$

In this manner, the potential $V_p$ decreases according to equation 4 and when it reaches a value $V\alpha = [R_f/(R_f + R_5)] V_Q$ shown in FIG. 4c, the output from the differential amplifier A will rise to a value nearly equal to the potential of the source E thus turning ON transistor $T_1$ and OFF transistor $T_2$.

Thus, in the case where $V_o = V\alpha$, the circuit undergoes a relaxation oscillation, thus alternately flickering lamps $L_1$ and $L_2$. In this manner, the range of the potential at point O in which the relaxation oscillation occurs in the circuit is determined by the maximum potential and the minimum potential, which the potential $V_p$ at point P can assume, in other words, the range at $t = \infty$ in equations 3 and 4.

When $t = \infty$, equations 3 and 4 can be rewritten as the following equations 5 and 6, respectively.

$$V_Q + [R_5/(R_5+R_f)](E - V_Q) = V_\beta \quad (5)$$

$$[R_f/(R_5+R_f)]\, V_Q = V_Q - [R_5/(R_5+R_f)]\, V_Q = V_\alpha \quad (6)$$

From equations 5 and 6, the range of potential $V_o$ in which the relaxation oscillation occurs can be determined as follows $$V_\alpha = V_Q - [R_5/(R_5+R_f)]\, V_Q \leqq V_Q \leqq V_Q + [R_5/(R_5 + R_f)](E - V_Q) = V_\beta$$

There will now be considered the case wherein the potential of the circuit which undergoes the relaxation oscillation under a condition $V_o = V_\alpha$ has increased to a value $V_o > V_\beta$ at the time $t_3$ shown in FIG. 5c. Then, the potential $V_p$ gradually decreases according to equation 4 during the interval between $t_2$ and $t_4$ as shown in FIG. 5c. When the potential $V_p$ reaches a value $V_p = V_\alpha$, the potential $V_p$ becomes $-(E - V_\alpha)$ and the circuit is changed from that shown in FIG. 3a to that shown in FIG. 3b. However, the potential is not varied by this change. Thereafter, the potential $V_p$ gradually increases according to equation 3 during the interval between $t_4$ and $t_5$ in FIG. 5c. However, by the reason described above, the potential $V_p$ does not exceed $V_\beta$ so that it will not reach $V_o$. For this reason, as the differential amplifier receives a higher input at its first input than at the second input the differential amplifier continues to produce an output which continues the ON condition of transistor $T_1$ and the OFF condition of transistor $T_2$, thus lighting only the first display lamp $L_1$. In this manner, the potential $V_o$ of point O at which the first display lamp $L_1$ alone is lighted has a relation $V_o > V_\beta$.

It is thus possible to determine the correct exposure by coinciding $V\alpha$ with the value of potential $V_o$ corresponding to the lower limit of the desired exposure and by coinciding $V_\beta$ with the value of potential $V_o$ corresponding to the upperlimit of the desired exposure.

The operations described above can be summarized as follows.

| Potential $V_o$ at point 0 | First display lamp $L_1$ | Second display lamp $L_2$ | Result of discrimination |
|---|---|---|---|
| $0 < V_o < V$ | Extinguished | Lighted | Under exposure |
| $V \leqq V_o \leqq V$ | Flicker | Flicker | Correct exposure |
| $V_\beta < V_o$ | Lighted | Extinguished | Excessive exposure |

FIG. 6 is a graph to show a range in which the circuit undergoes the relaxation oscillation, in which curve $V_\beta$ shows the upper limit of the desired value where resistor $R_f$ is varied and curve $V\alpha$ the lower limit of the desired value where resistor $R_f$ is varied. Accordingly, the region bounded by curves $V_\beta$ and $V\alpha$ represents the desired value and the width of the region decreases with the increase in the value of resistor $R_f$.

FIG. 7 illustrates one example of a display unit utilized in the novel discrimination circuit. As shown, the display unit comprises a casing F containing the first and second display lamps $L_1$ and $L_2$ connected to the outputs of transistors $T_1$ and $T_2$, respectively, shown in FIG. 1, a red filter $G_1$, a green filter $G_2$ and slits $H_1$ and $H_2$ each having a triangular perforation at the center. The apices of these triangular openings are directed in the opposite directions. The casing F further contains a semi-transparent mirror I positioned at the middle point on a line interconnecting the first and second display lamps $L_1$ and $L_2$ at an angle of about 45° with respect to the line. A mirror J is positioned behind the semi-transparent mirror I. The casing F is provided with a window K in front of the semi-transparent mirror I.

When only the first display lamp $L_1$ is lighted, the light emanated from lamp $L_1$ is projected upon the semi-transparent mirror I through red filter $G_1$ and slit $H_1$. The semi-transparent mirror functions to reflect about one half of the projected light to a point M so that the user can see a red pattern having a configuration as shown in FIG. 8a. On the other hand, where only the second display lamp $L_2$ is lighted the light emanated therefrom is projected upon the semitransparent mirror I through green filter $G_2$ and slit $H_2$. The semitransparent mirror I reflects about one half of the light from the second display lamp $F_2$ toward mirror J.

The light is reflected by mirror J toward point M through the semitransparent mirror I. Again, a green pattern having a configuration as shown in FIG. 8b can be seen. Where lamps $L_1$ and $L_2$ are flickered at a frequency higher than 30 $H_z$, for example, patterns shown by FIGS. 8a and 8b superpose each other as shown by FIG. 9. The superposed portions of the red and green patterns look yellow whereas at portions outside the superposed portions red and green light flicker alternately.

The display unit described above can be advantageously incorporated into a finder of a photographic camera so as to readily determine the result of discrimination or the correct exposure.

Although the foregoing example relates to an application of the invention to determine the correct exposure by using a photoconductive element it should be understood that the invention is not limited to the particular application, and that it is possible to determine various physical quantities by converting them into corresponding electric quantities by using suitable transducers. For example, it is possible to measure temperature by using a thermistor. Where lights of different colors are mixed together by varying the period of flickering it is possible to produce lights of different colors under the relaxation condition of the circuit.

Moreover, as the novel discrimination circuit includes a differential amplifier and a potentiometer circuit for applying a constant voltage to the differential amplifier, the operation of the discrimination circuit is very stable even when the input to the differential amplifier varies greatly.

The modified embodiment shown in FIG. 10 is different from the first embodiment in the following points. More particularly, resistors $R_8$ and $R_9$ are connected in series with the collector electrodes, respectively, of transistors $T_1$ and $T_2$. The collector electrode of transistor $T_2$ is connected to the base electrode of transistor $T_8$ through a coupling capacitor $C_2$ and a rectifier diode D. An integrating capacitor $C_3$ and a resistor $R_{10}$ are connected in parallel between the base electrode of transistor $T_8$ and the ground and a variable resistor $R_{11}$ is connected between the collector electrode of transistor $T_8$ and the ground. The movable arm of variable resistor $R_{11}$ is coupled with the base electrode of a transistor $T_9$. The collector electrode of transistor $T_9$. is connected to the source through a first lamp $L_1$ and further to the base electrode of a transistor $T_{10}$ via a resistor $R_{12}$. The collector electrode of transistor $T_{10}$ is connected to the second and third lamps $L_2$ and $L_3$, respectively through transistors $T_6$ and $T_7$, the base electrodes thereof being connected to the collector electrodes of transistors $T_1$ and $T_2$, respectively. When the potential $V_o=(R_2 \cdot I)/(R_1+R_2)$ at point O varies in accordance with the intensity of the light impinging upon photoconductive element $R_1$ as above described, first, second and third display lamps $L_1$, $L_2$, and $L_3$ are operated in the following manner.

1. Lamp $L_1$ is extinguished, lamp $L_2$ is lighted, lamp $L_3$ is extinguished,
2. Lamp $L_1$ is lighted, lamp $L_2$ is extinguished, lamp $L_3$ is extinguished, and
3. Lamp $L_1$ is extinguished, lamp $L_2$ is extinguished, lamp $L_3$ is lighted.

The operation of the circuit up to transistor $T_1$ and $T_2$ when the potential $V_o$ increases is identical to that already described in connection with FIG. 1. While the potential $V_o$ is low, transistor $T_1$ is OFF and transistor $T_2$ is ON. Under these conditions, the potential $V_p$ at point P is maintained at a substantially constant value because the potential $V_Q$ at the juncture Q between potentiometer resistors $R_3$ and $R_4$ is maintained constant. Under these conditions, the potential $V_T$ at point T is substantially zero so that transistor $T_3$ and hence transistor $T_9$ with its base electrode connected to the emitter electrode of transistor $T_8$ are maintained OFF. However, since the base electrode of transistor $T_{10}$ is connected to the source via resistor $R_{12}$ and the first display lamp $L_1$, this transistor is rendered conductive. Further, since transistor $T_1$ is OFF whereas transistor $T_2$ is ON as above described, the potential $V_s$ at point S is nearly equal to that of source E and the potential $V_T$ at point T is at substantially the ground potential. For this reason, transistor $T_6$ with its base electrode connected to point S becomes ON to light only the second display lamp $L_2$. Operation of this lamp means that the first input potential to the differential amplifier A is lower than the first input potential, in other words, that the brightness of the light impinging upon the photoconductive element $R_1$ is low. The range in which the second display lamp $L_2$ is lighted is given by equation 2 described above.

Assuming now that the brightness of the light imping upon the photoconductive element increases beyond the previous value to satisfy a condition $V_o=V_p=V\alpha$, then transistor $T_1$ becomes ON whereas transistor becomes OFF at time $t_1$ shown in FIG. 4a, as above described so that the potential $V_p$ at point P increases according to equation 3. As the incident light increases further, transistors $T_1$ and $T_2$ becomes ON and OFF alternately so that the discrimination circuit creates a relaxation oscillation in a manner already described and the range of potential $V_o$ in which the relaxation oscillation is produced is given by equations 5 and 6.

When transistor $T_2$ repeats ON and OFF operations the AC component is taken out through coupling capacitor $C_2$ and is then rectified by diode D. The output of the diode is integrated by the integrating capacitor $C_3$. When the voltage across capacitor $C_3$ exceeds a predetermined value, the buffer transistor $T_8$ and transistor $T_9$ connected to the output thereof are rendered ON, thus lighting the first display lamp $L_1$. The lighting of this lamp means a condition $V_\alpha \leq V_O \leq V_\beta$ $V$. At this time, the second and third dispaay lamps $L_2$ and $L_3$ will not be lighted because transistor $T_4$ is ON to decrease the base potential of transistor $T_{10}$ to substantially zero voltage, thus rendering OFF transistor $T_{10}$.

As above described under a condition of $V_o=V\alpha$ and the circuit undergoes the relaxation oscillation, the transistor $T_1$ is maintained ON while transistor $T_2$ is maintained OFF. Under these conditions, the potential $V_T$ at point T becomes substantially equal to the voltage of the source E but due to the inclusion of capacitor $C_2$ and diode D, only one output pulse is applied to transistor $T_3$ thus maintaining the OFF condition of both transistors $T_8$ and $T_9$. Consequently, in the same manner as above described transistor $T_{10}$ becomes ON. At the same time, a rise in the potential $V_T$ at point T renders ON transistor $T_7$ thus lighting the third display lamp $L_3$ alone. In this manner, lighting of this lamp $L_3$ means that the potential $V_o$ at point O is higher than the potential $V_p$ at point P.

Again it is possible to determine the correct exposure by coinciding $V\alpha$ with the value of potential $V_o$ corresponding to the lower limit of the desired exposure and by coinciding $V_\beta$ with the value of potential $V_o$ corresponding to the upper limit of the desired exposure.

The operation of the circuit shown in FIG. 10 can be summarized as follows:

| Potential $V_0$ at point 0° | First display lamp $L_1$ | Second display lamp $L_2$ | Third display lamp $L_3$ | Restul of discrimination |
|---|---|---|---|---|
| $0 < V_0 < Va$ | Extinguished | Lighted | Extinguished | under exposure |
| $V_\alpha \leqq V_0 \leqq V_\beta$ | Lighted | Extinguished | Extinguished | Correct exposure |
| $V_\beta < V_0$ | Extinguished | Extinguished | Lighted | Excessive exposure |

If display lamps of different colors were used, discrimination of exposure will becomes easier. Further, the result of discrimination is not effected by the characteristics of the display lamps.

While the invention has been shown and described in terms of preferred embodiments thereof, it should be understood that many changes and modifications may be made within the scope of the invention as defined in the appended claims.

What is claimed is:

1. A discrimination circuit comprising:

converter means for converting a physical quantity into an electrical quantity;

a differential amplifier having a first input terminal connected to the output terminal of said converter means, and a second input terminal, said differential amplifier producing an output only when the potential of said first input terminal exceeds that of said second input terminal;

first and second switching means connected to one of the outputs of said differential amplifier to be driven alternately;

first and second display lamps controlled by the outputs of said first and second switching elements, respectively;

a capacitor connected between the output of said first switching means and said second input terminal of said differential amplifier;

a first resistor connected between the output of said second switching means and said second input terminal of said differential amplifier;

a source of electrical power supply;

a resistance potentiometer connected across said electrical power source to produce a constant potential; and a second resistor for supplying said constant potential to said of said differential amplifier;

said differential amplifier driving one of said first and second switching means when the potential of said first input terminal of said differential amplifier exceeds that of said second input terminal, and the output of at least one of said first and second switching means being fed back to said second input terminal of said differential amplifier through at least one of said capacitor and said first resistor so as to selectively operate said first and second display lamps.

2. The discrimination circuit according to claim 1 wherein said first and second switching means comprise cascade connected transistors, and said first and second display lamps are respectively connected to the collector electrodes of said transistors.

3. The discrimination circuit according to claim 1 which further includes a display unit including a casing containing at least said first and second display lamps in spaced apart relationship, an aligned slit and filter for each one of said first and second display lamps, a semi-transparent mirror disposed between said first and second display lamps and inclined 45° with respect a line interconnecting said first and second display lamps, and a reflecting mirror on the back of said semi-transparent mirror, said reflecting mirror being parallel with said interconnecting line.

4. The discrimination circuit according to claim 3 wherein the slits associated with respective display lamps are in the form of triangular openings having apices directed in the opposite directions.

5. The discrimination circuit according to claim 3 wherein said filters associated with respective display lamps transmit light of different colors.

6. The discrimination circuit according to claim 1 wherein each of said switching means comprises at least one transistor.

7. The discrimination circuit according to claim 1 wherein said first and second switching means respectively comprise first and second switching transistors, the base electrode of said first transistor being coupled to the output of said differential amplifier, one of said emitter and collector electrodes of said first transistor being coupled to a fixed potential and the other of said emitter and collector electrodes of said first transistor comprising the output of said first switching means and being coupled to said capacitor and to said first display lamp; the base electrode of said second transistor being coupled to the output of said first switching means, one of said emitter and collector electrodes being coupled to said fixed potential and the other of said emitter and collector electrodes of said second transistor comprising the output of said second switching means and being coupled to said first resistor and to said second display lamp.

8. A discrimination circuit comprising:

converter means for converting a physical quantity into an electrical quantity;

a differential amplifier having a first input terminal connected to the output terminal of said converter means, and a second input terminal, said differential amplifier producing an output only when the potential of said first input terminal exceeds that of said second input terminal;

first and second switching means connected to one of the outputs of said differential amplifier to be driven alternately;

a capacitor connected between the output of said first switching means and said second input terminal of said differential amplifier;

a first resistor connected between the output of said second switching means and said second input terminal of said differential amplifier;

a source of electrical power supply;

a resistance potentiometer connected across said electrical power source to produce a constant potential;

a second resistor for supplying said constant potential to said second input terminal of said differential amplifier;

a rectifier-integrator connected to the output of one of said switching means for rectifying the AC component of said output and for integrating the rectified AC component;

a third switching means connected to the output side of said rectifier-integrator, said third switching means operating when the output from said rectifier-integrator exceeds a predetermined value;

a first display lamp operated by the output from said third switching means;

a fourth switching means connected to operate when the output from said third switching means coincides with the output from said first switching means;

a fifth switching means connected to operate when the output from said third switching means coincides with the output from said second switching means;

a second display lamp connected to the output of said fourth switching means; and a third display lamp connected to the output of said fifth switching means;

said differential amplifier driving one of said first and second switching elements when the potential of said first input terminal exceeds that of said second input terminal, and the output of at least one of said first and second switching means being fed back to said second input of said differential amplifier through at least one of said capacitor and said first resistor so as to selectively operate said first, second and third display lamps.

9. The discrimination circuit according to claim 8 wherein each of said switching means comprises at least one transistor. a fixed potential and the other of said emitter and collector

10. The discrimination circuit according to claim 9 wherein the base electrode of said first transistor is coupled to the output of said differential amplifier, one of said emitter and collector electrodes of said first transistor being coupled to a fixed electrodes of said first transistor comprising the output of said first switching means and being coupled to said capacitor; the base electrode of said second transistor being coupled to the output of said first switching means, one of said emitter and collector electrodes of said second transistor being coupled to said fixed potential and the other of said emitter and collector electrodes of said second transistor comprising the output of said second switching means and being coupled to said first resistor; the base electrode of said third transistor being coupled to the output side of said rectifier-integrator, one of said emitter and collector electrodes being coupled to said fixed potential via a resistance potentiometer which provide the output of said third switching means and which is coupled to said first display lamp; the base electrode of said fourth transistor being coupled to the output of said first switching means, one of the emitter and collector electrodes of said fourth transistor being coupled to the output of said third switching means and the other of said emitter and collector electrodes of said fourth transistor being coupled to said second display lamp; and the base electrode of said fifth transistor being coupled to the output of said second switching means, one of the emitter and collector electrodes of said fifth transistor being coupled to the output of said third switching means and the other of said emitter and collector electrodes of said fifth transistor being coupled to said third display lamp, said third, fourth and fifth transistors selectively operating said first, second and third display lamps, respectively.

* * * * *